(12) United States Patent
Chen et al.

(10) Patent No.: US 6,285,275 B1
(45) Date of Patent: Sep. 4, 2001

(54) SURFACE MOUNTABLE ELECTRICAL DEVICE

(75) Inventors: Jack Jih-Sang Chen, Taipei; Chun-Ta Tseng, Taipei Hsien; Ching-Chiang Yeh, San-Chung, all of (TW)

(73) Assignee: Fuzetec Technology Co., Ltd., Hsin-Chuang (TW)

( * ) Notice: Subject to any disclaimer, the term of this patent is extended or adjusted under 35 U.S.C. 154(b) by 0 days.

(21) Appl. No.: 09/811,097

(22) Filed: Mar. 16, 2001

Related U.S. Application Data

(63) Continuation-in-part of application No. 09/662,978, filed on Sep. 15, 2000.

(51) Int. Cl.[7] .................................................. H01C 7/10
(52) U.S. Cl. ....................... 338/22 R; 338/327; 338/328; 338/314; 338/312
(58) Field of Search ............................. 338/22 R, 225 D, 338/327, 328, 332, 314, 312, 309

(56) References Cited

U.S. PATENT DOCUMENTS

| | | |
|---|---|---|
| 5,334,968 | 8/1994 | Negoro . |
| 5,572,779 | 11/1996 | Adelman et al. . |
| 5,852,397 * | 12/1998 | Chan et al. ........................ 338/22 R |
| 5,864,281 | 1/1999 | Zhang et al. . |
| 5,884,391 | 3/1999 | McGuire et al. . |
| 6,023,403 | 2/2000 | McGuire et al. . |

FOREIGN PATENT DOCUMENTS 4-357801     12/1992  (JP) .

* cited by examiner

*Primary Examiner*—Karl D. Easthom
(74) *Attorney, Agent, or Firm*—Merchant & Gould P.C.

(57) ABSTRACT

A surface mountable electrical devices includes a PTC resistive element having opposite first and second surfaces and lateral faces interconnecting the first and second surfaces, spaced apart first and third electrode layers formed on the first surface, a second electrode layer formed on the second surface, and a conductive layer. Each two adjacent lateral faces defines a corner that has a terraced face. The conductive layer has a first lateral segment formed on the third electrode layer, a second lateral segment formed on the second electrode layer, and a transverse segment formed on the terraced face of one of the corners and having a terraced cross-section.

4 Claims, 12 Drawing Sheets

US 6,285,275 B1

SURFACE MOUNTABLE ELECTRICAL DEVICE

CROSS-REFERENCE TO RELATED APPLICATION

This application is a continuation-in-part (CIP) of co-pending U.S. Patent Application No. 09/662,978, filed by the applicant on Sept. 15, 2000, the entire disclosure of which is incorporated herein by reference.

BACKGROUND OF THE INVENTION

1. Field of the Invention

This invention relates to a surface mountable electrical device, more particularly to a surface mountable electrical device that can serve as a circuit protection device, such as a fuse.

2. Description of the Related Art

FIG. 1 illustrates a conventional circuit protection device 10 disclosed in U.S. Pat. No. 5,852,397. The device 10 is prepared from a laminate having an array of drilled apertures. The laminate is cut into a plurality of the devices along intersecting cutting lines in two directions. The apertures are located at positions where the cutting lines intersect. The device 10 includes a planar PTC (positive temperature coefficient) resistive element 11 having opposite first and second surfaces 111, 112, and four apertures 113 of quarter circular cross-section that run between the first and second surfaces 111, 112 at four corners of the PTC resistive element 11, first and second electrode layers 12, 13 respectively covering portions of the first and second surfaces 111, 112, third and fourth electrode layers 14, 15 respectively covering other portions of the first and second surfaces 111, 112 and spaced apart from the first and second electrode layers 12, 13, a first plating layer 16 having first and second portions 161, 162 respective covering the first and fourth electrode layers 12, 15 and two spaced apart first transverse portions 163 extending between the first and second portions 161, 162 within two of the apertures 113 that are adjacent to the fourth electrode layer 15, and a second conductive layer 17 having third and fourth portions 171, 172 respectively covering the second and third electrode layers 13, 14 and two second transverse portions 173 extending between the third and fourth portions 171, 172 within another two of the apertures 113 that are adjacent to the third electrode layer 14. The first and second transverse portions 163, 173 have a quarter circular cross-section corresponding to those of the apertures 113. Aside from being formed at the corners of the PTC resistive element 11 and having quarter cross-sections, the aforesaid apertures 113 can be formed at any other positions in the PTC resistive element 11, and can have a closed cross-section, such as a circular, an oval, or a rectangular shape, or a reentrant cross-section that denotes an open cross-section which has a depth of at least 0.15 times the maximum width thereof and which has at least one part where the opposite edges of the cross section are parallel to each other in order to ensure that the first and second transverse portions 163, 173 of the first and second plating layers 16, 17 will not be damaged or dislodged during installation or use of the device 10. However, since the maximum width of each aperture 113 is very small, which is normally designed to be within a range of 0.2 to 0.5 mm, there is a tendency for the first and second transverse portions 163, 173 of the first and second plating layers 16, 17 to be damaged or dislodged during the process of cutting the laminate to form the devices 10 with apertures of reentrant cross-sections, and there is a need for a relatively high accuracy to maintain the aforementioned cutting lines.

FIGS. 2 and 3 illustrate another conventional circuit protection device 8 disclosed in U.S. Pat. No. 5,884,391. The device 8 is prepared from a laminar sheet 9 having an array of strips 90 that includes a plurality of repeated units 92 that are to be processed into the devices 8, and an array of elongated slits 91 at intervals of the strips 90. The device 8 includes a PTC resistive element 80 with opposite first and second surfaces 801, 802, first and second electrode layers 81, 82 respectively formed on portions of the first and second surfaces 801, 802, third and fourth electrode layers 83, 84 respectively formed on other portions of the first and second surfaces 801, 802, first and second insulating layers 85, 86 respectively formed on portions of the first and third electrode layers 81, 83 and portions of the second and fourth electrode layers 82, 84, U-shaped first and second conductive layers 87, 88 respectively formed on and interconnecting portions of the first and fourth electrode layers 81, 84 and portions of the second and third electrode layers 82, 83, and U-shaped first and second end terminations 871, 881 respectively superimposed on the first and second conductive layers 87, 88. Each of the U-shaped first and second conductive layers 87, 88 has two lateral segments (871, 881) that extend in lateral directions along the first and second surfaces 801, 802, and a transverse segment (872, 882) that extends in a transverse direction relative to the first and second surfaces 801, 802 at one side of the PTC resistive element 80 that faces a respective slit 91. Since the transverse segment (871, 881) of each of the first and second conductive layers (87, 88) is only formed on one side of the PTC resistive element 80, the device 8 still encounters the same problem of the previous device 10 disclosed in U.S. Pat. No. 5,852,397, and needs a relatively high accuracy when cutting the units of the laminar sheet 9 into the devices 8.

SUMMARY OF THE INVENTION

Therefore, the object of the present invention is to provide a surface mountable electrical device that is capable of overcoming the aforementioned drawbacks.

According to the present invention, a surface mountable electrical device comprises: a PTC resistive element having opposite first and second surfaces and a plurality of planar lateral faces transverse to and interconnecting the first and second surfaces, each of two adjacent ones of the lateral faces defining a corner therebetween, the corner being indented relative to the two adjacent ones of the lateral faces and having a terraced face that interconnects the two adjacent ones of the lateral faces and that has a first tread face extending from one of the two adjacent ones of the lateral faces, a first rise face extending from and transverse to the first tread face, a second tread face extending from and transverse to the first rise face in a same direction as the first tread face, and a second rise face extending from and transverse to the second tread face in a same direction as the first rise face to connect with the other one of the two adjacent ones of the lateral faces; first and second electrode layers formed respectively on the first and second surfaces; a third electrode layer formed on the first surface and spaced apart from the first electrode layer; and a first conductive layer that has a first lateral segment formed on the third electrode layer, a second lateral segment formed on the second electrode layer, and a transverse segment transverse to and interconnecting the first and second lateral segments. The transverse segment is formed on the terraced face of one of the corners and has a terraced cross-section corresponding to the terraced face of said one of the corners.

BRIEF DESCRIPTION OF THE DRAWINGS

In drawings which illustrate embodiments of the invention.

DETAILED DESCRIPTION OF THE PREFERRED EMBODIMENTS

Figure 1:
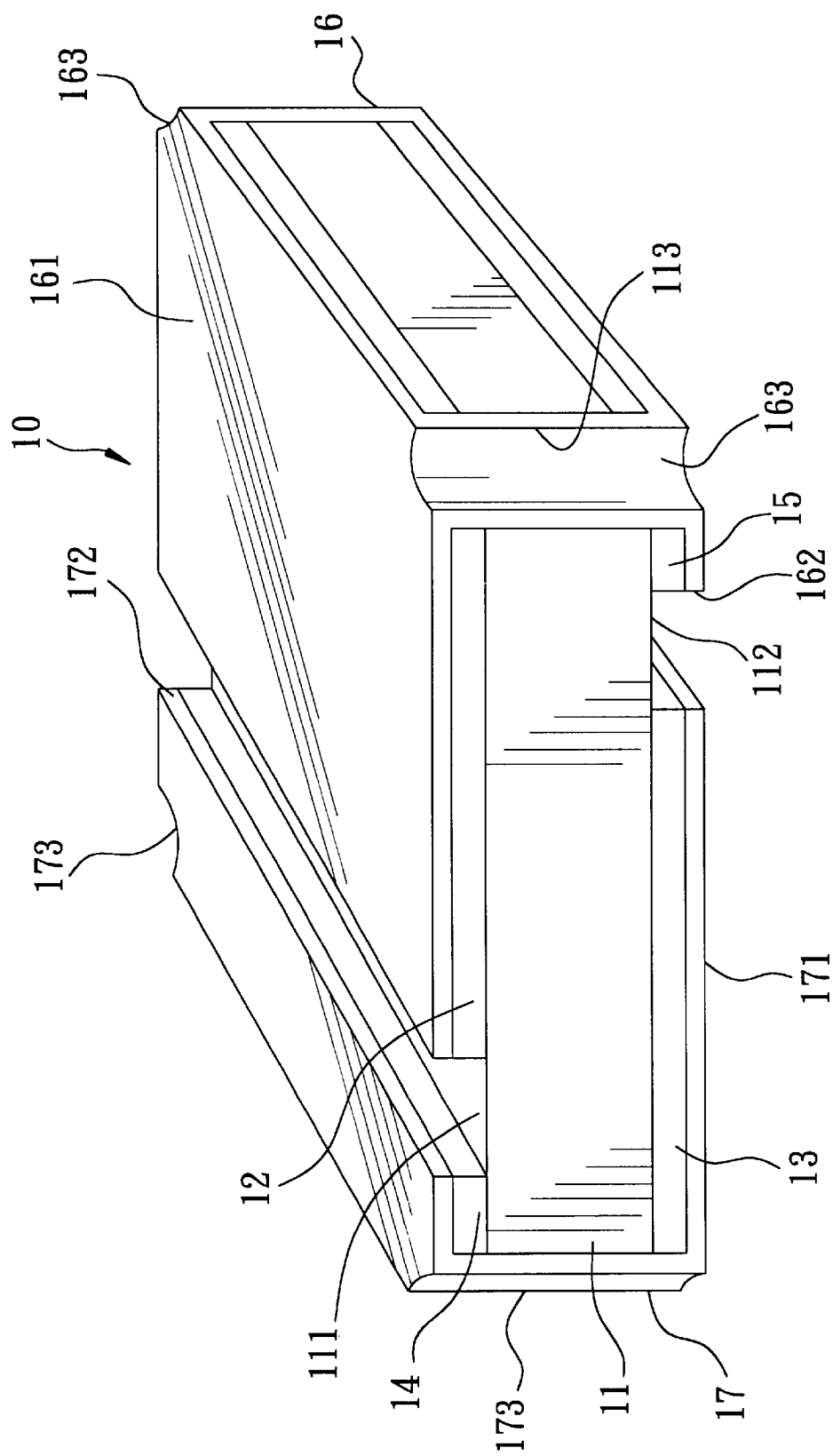
FIG. 1 is a perspective view of a conventional circuit protection device.
Figure 2:
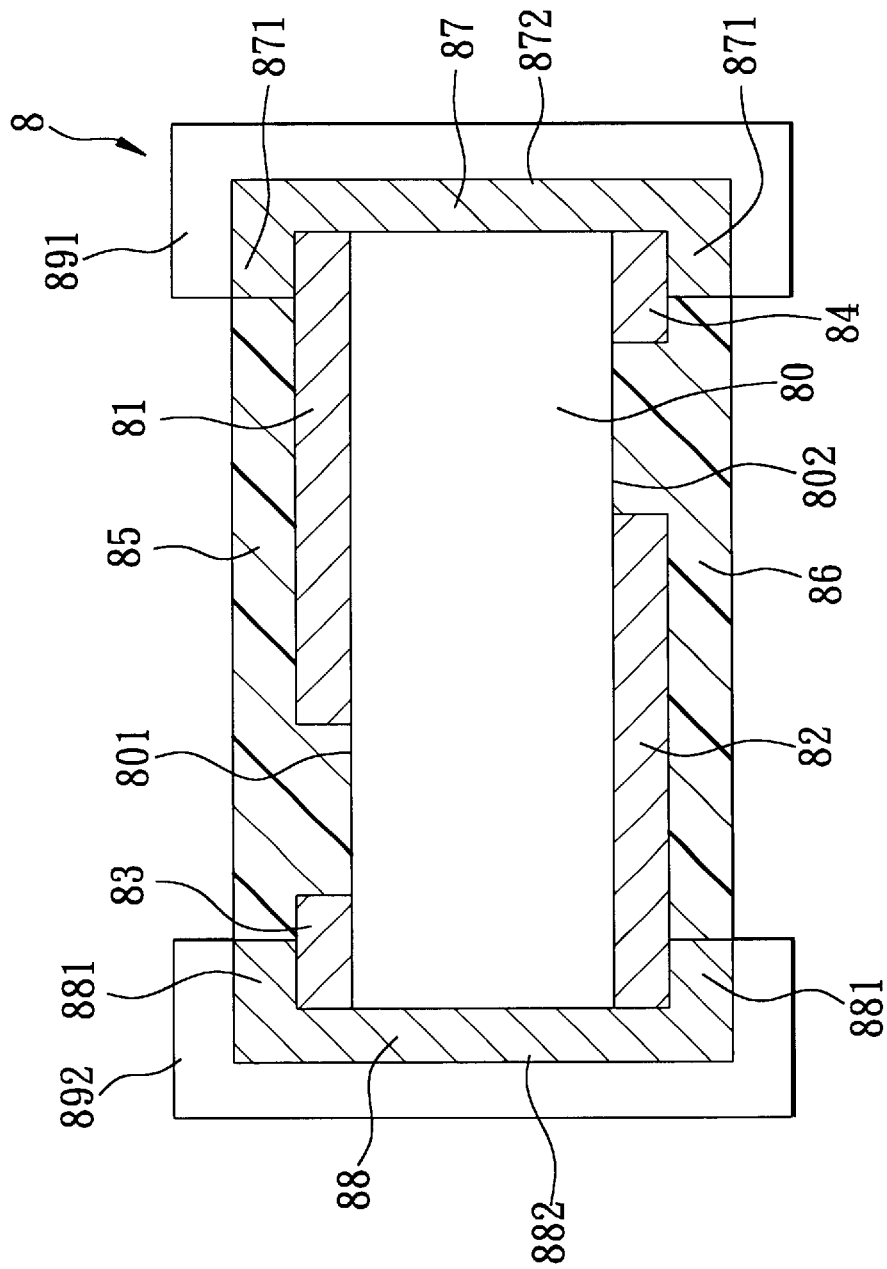
FIG. 2 is a cross-sectional view of another conventional circuit protection device.
Figure 3:
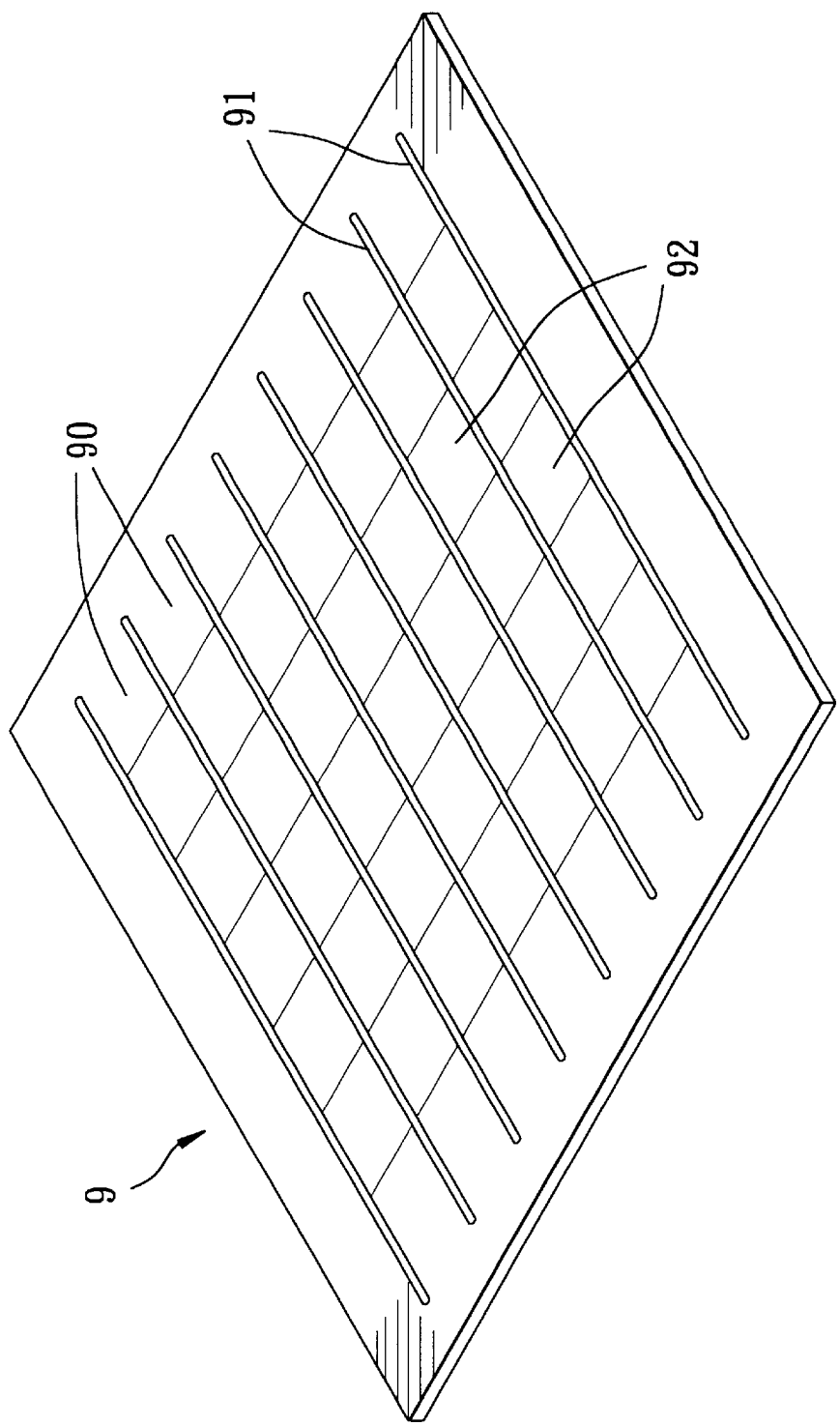
FIG. 3 is a perspective view to illustrate a PTC resistive sheet with strips formed therein for preparing the conventional circuit protection device of FIG. 2.
Figure 4:
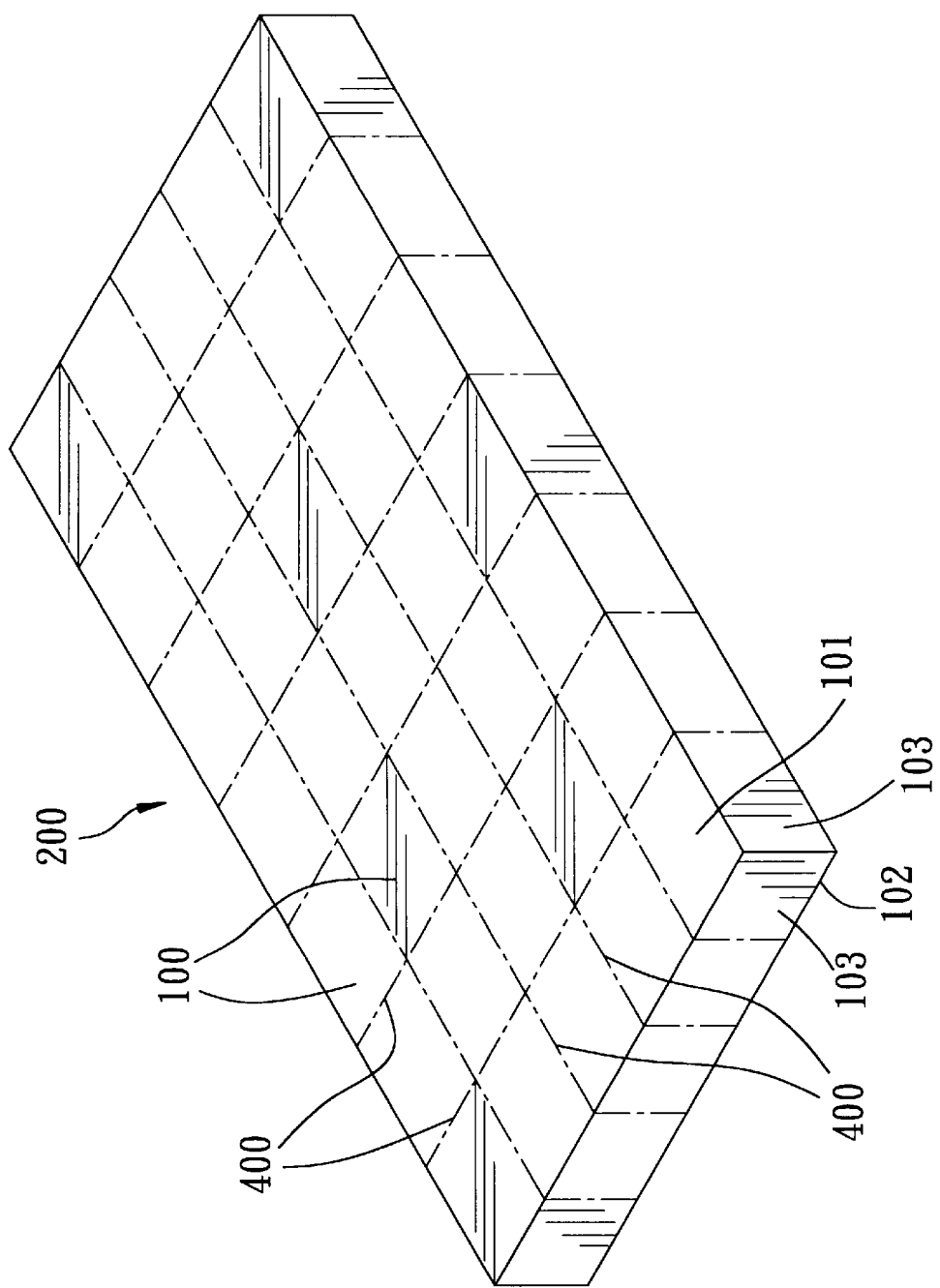
FIG. 4 is a perspective view of a PTC resistive sheet which is to be cut into a plurality of elements according to a process for preparing surface mountable electrical devices that embody this invention.

FIGS. 4 to 10 illustrate consecutive processing steps for making surface mountable electrical devices embodying this invention.

The devices are prepared from a laminar positive thermal coefficient (PTC) resistive sheet 200 which is to be cut into a plurality of repeated PTC resistive elements 100 along intersecting cutting lines 400 for making the devices. Each PTC resistive element 100 has opposite first and second surfaces 101, 102 and a plurality of planar lateral faces 103 transverse to and interconnecting the first and second surfaces 101, 102.

Figure 5:
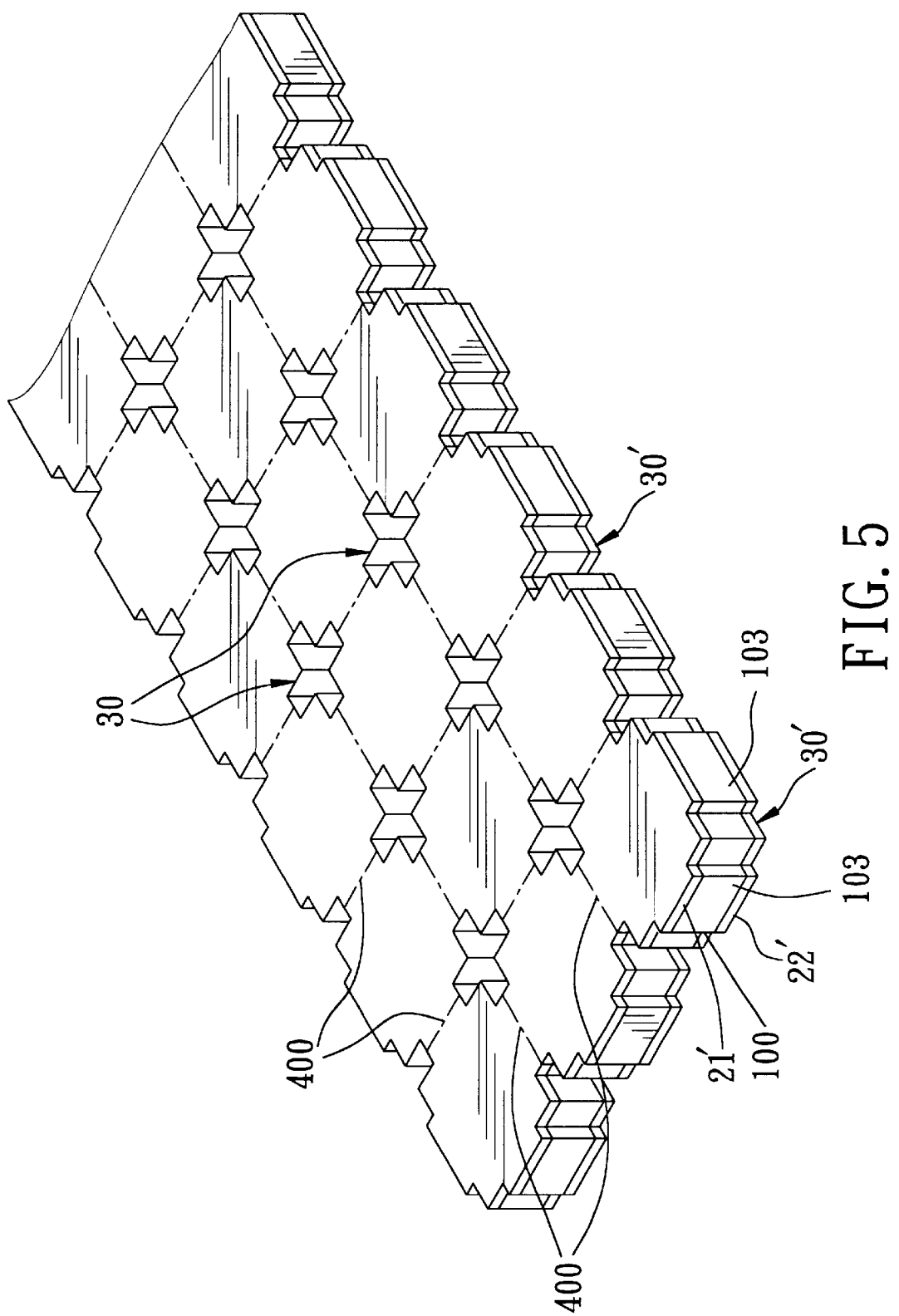
FIG. 5 is a fragmentary perspective view of the PTC resistive sheet of FIG. 4, formed with two metal foil layers and array of cross-shaped bores according to the process of this invention.
Figure 6:
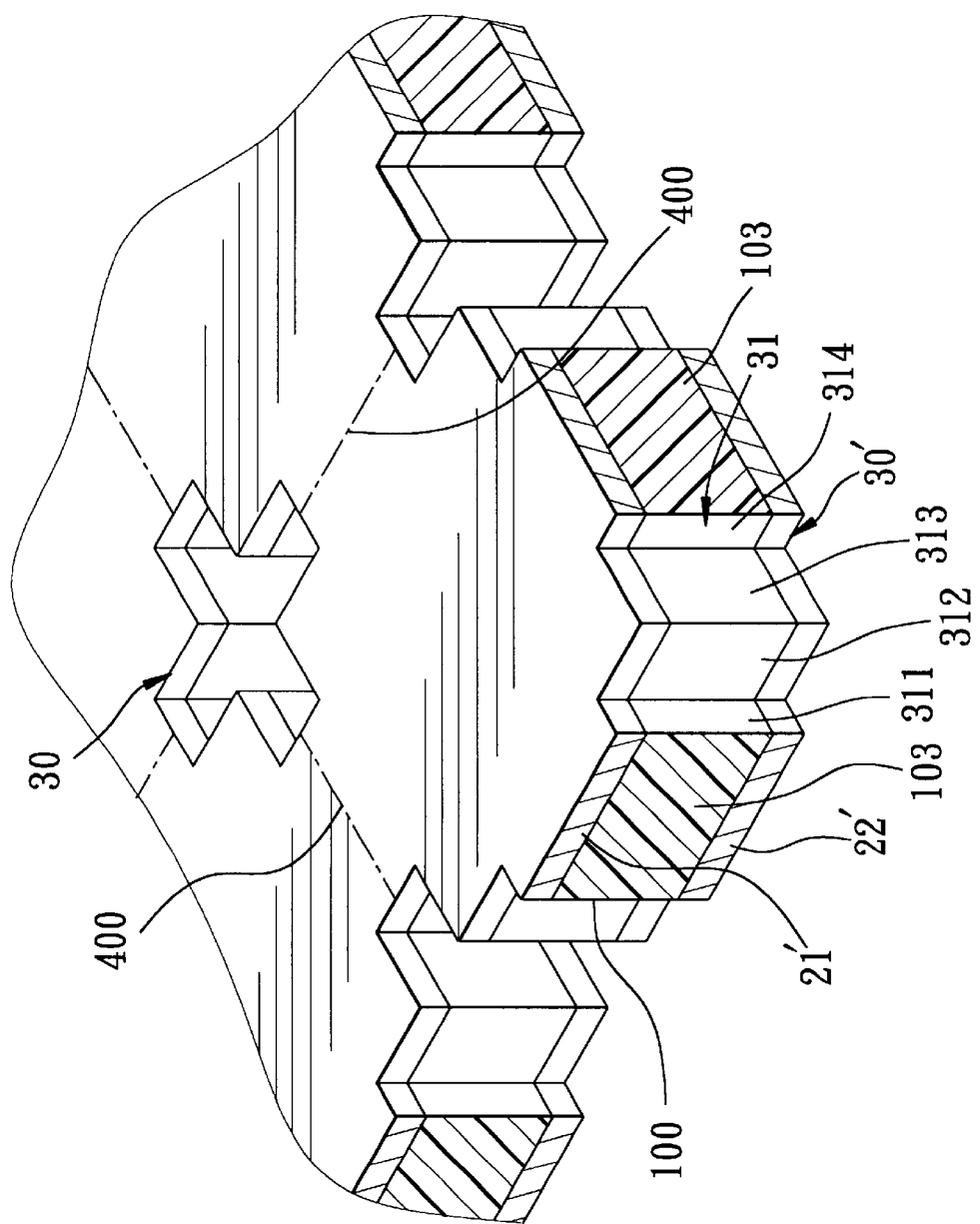
FIG. 6 is an enlarged fragmentary perspective view of an assembly of the element and the two metal foil layers of the PTC resistive sheet of FIG. 5.

In FIGS. 5 and 6, the first and second surfaces 101, 102 of each PTC resistive element 100 are respectively covered with first and second metal foil layers 21', 22' which are to serve as first, second, third, and fourth electrode layers 21, 22, 23, 24 on the PTC resistive element 100 (see FIG. 8) in the subsequent processing steps of making the devices. The assembly of the PTC resistive sheet 200 and the first and second metal foil layers 21', 22' is subjected to a drilling or a punching process to form an array of cross-shaped bores 30 at intersections of the cutting lines 400. As such, the assembly is formed with a quarter of the cross-shaped bore 30 at a respective corner 30' defined by two adjacent ones of the lateral faces 103 of the PTC resistive element 100. The corner 30' is indented relative to the two adjacent ones of the lateral faces 103, and has a terraced face 31 that interconnects the two adjacent ones of the lateral faces 103 and that has a first tread face 311 transverse to and extending from one of the two adjacent ones of the lateral faces 103, a first rise face 312 extending from and transverse to the first tread face 311, a second tread face 313 extending from and transverse to the first rise face 312 in a same direction of the first tread face 311, and a second rise face 314 extending from and transverse to the second tread face 313 in a same direction of the first rise face 312 to connect with the other one of the two adjacent ones of the lateral faces 103.

Figure 7:
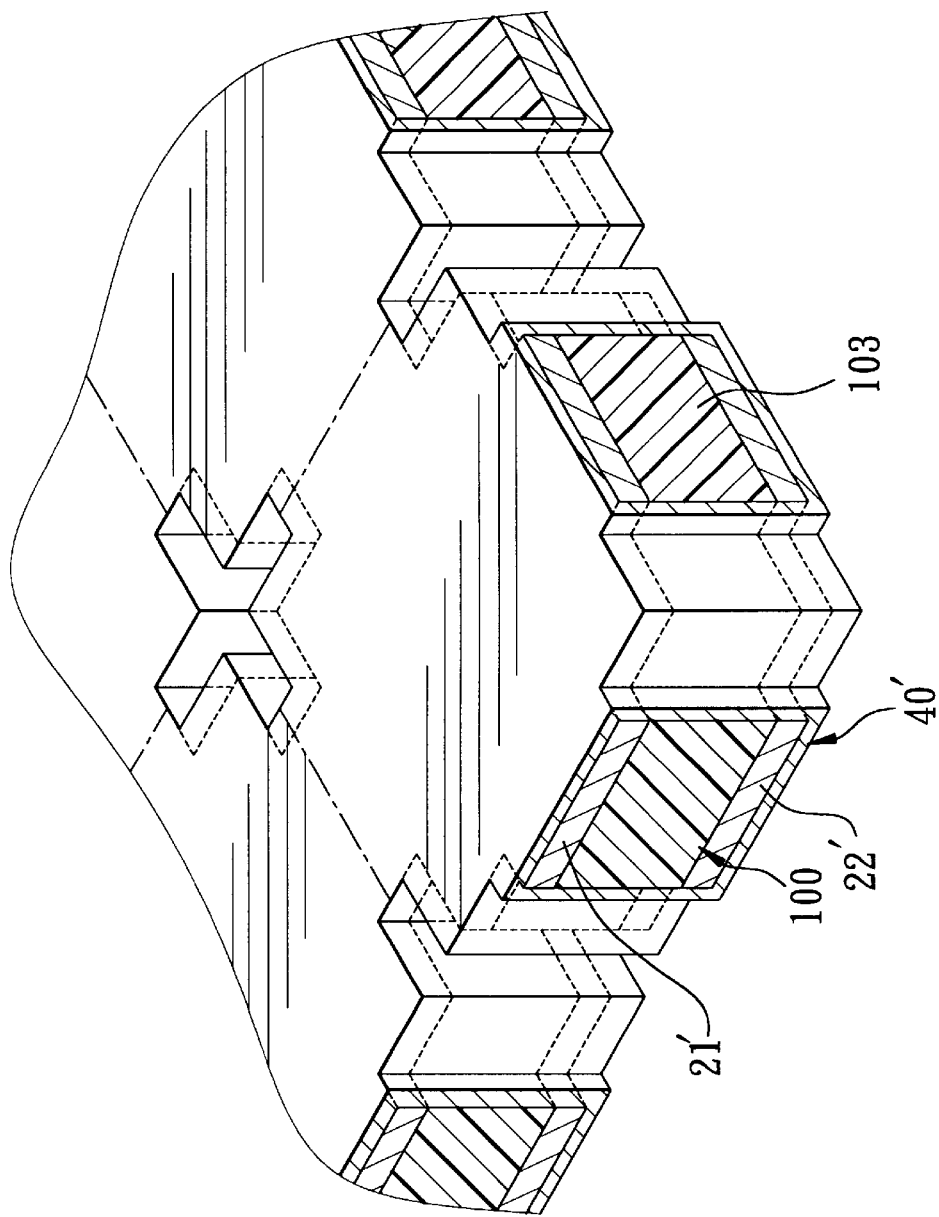
FIG. 7 illustrates a plating layer formed on the assembly of the element and the two metal foil layers of FIG. 6 according to the process of this invention.

In FIG. 7, after formation of the bores 30, the assembly of the PTC resistive sheet 200 and the first and second metal foil layers 21', 22' is formed with a first plating layer 40' which is to serve as first and second conductive layers 41, 42 in the subsequent processing steps for making the devices (see FIG. 8) and which is carried out via any known plating techniques.

Figure 8:
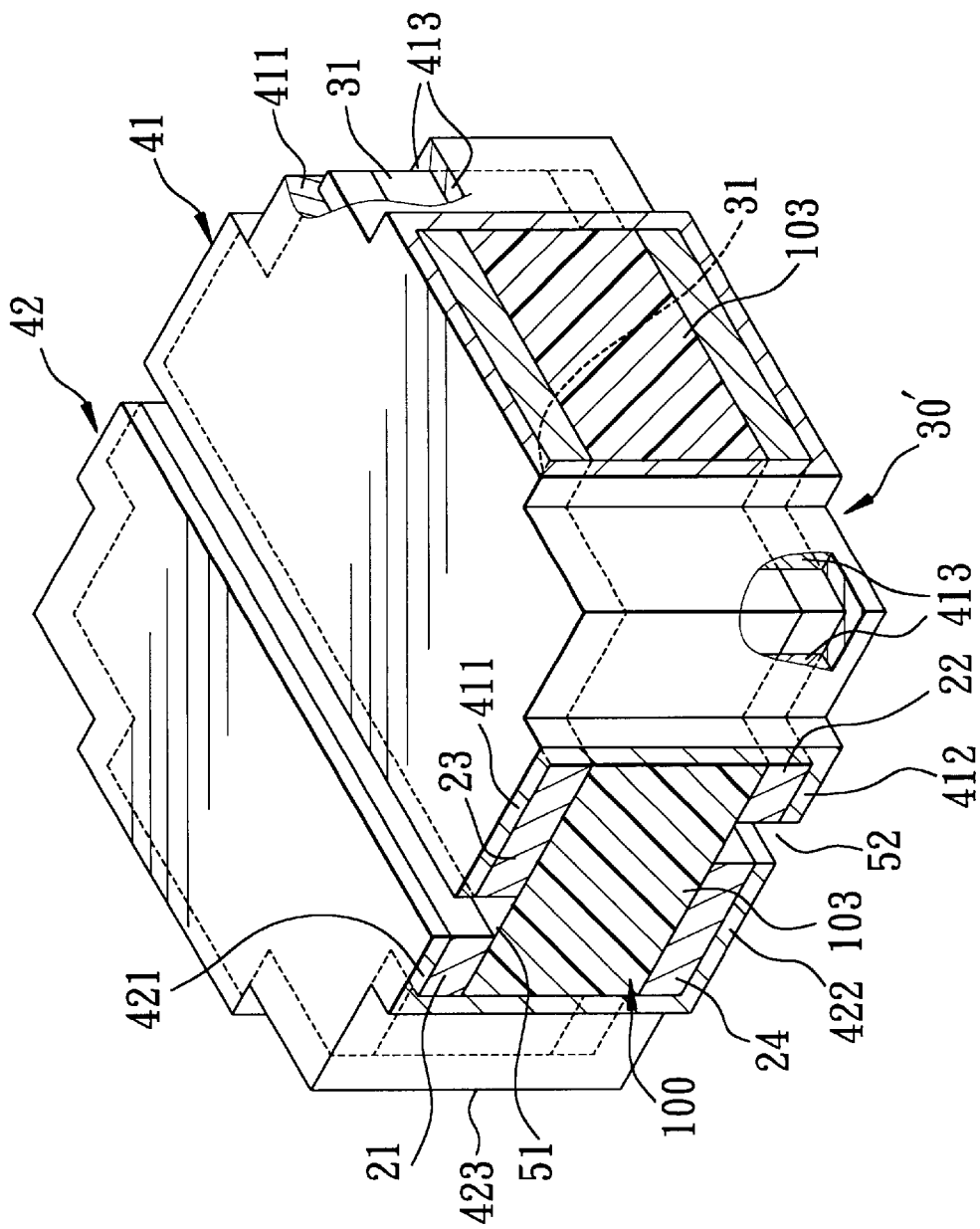
FIG. 8 illustrates two recesses formed in the assembly of the plating layer, the element, and the two metal foil layers of FIG. 7 according to the process of this invention.

In FIG. 8, the assembly of the first plating layer 40', the PTC resistive sheet 200, and the first and second metal foil layers 21', 22' is formed with first and second recesses 51, 52 so as to divide the first metal foil layer 21' into the first and third electrode layers 21, 23, to divide the second metal foil layer 22' into the second and fourth electrode layers 22, 24, and to divide the first plating layer 40' into the first and second conductive layers 41, 42.

The first and second conductive layers 41, 42 have first lateral segments 411, 421 respectively formed on the third and first electrode layers 23, 21, second lateral segments 412, 422 respectively formed on the second and fourth electrode layers 22, 24, and transverse segments 413, 423 respectively transverse to and interconnecting the first and second lateral segments 411, 421, 412, 422. Each of the transverse segments 413, 423 of the first and second conductive layers 41, 42 is formed on a respective one of the corners 30' defined by two adjacent lateral faces 103, and has a terraced cross-section corresponding to the terraced face 31 of the respective corner 30'.

Figure 9:
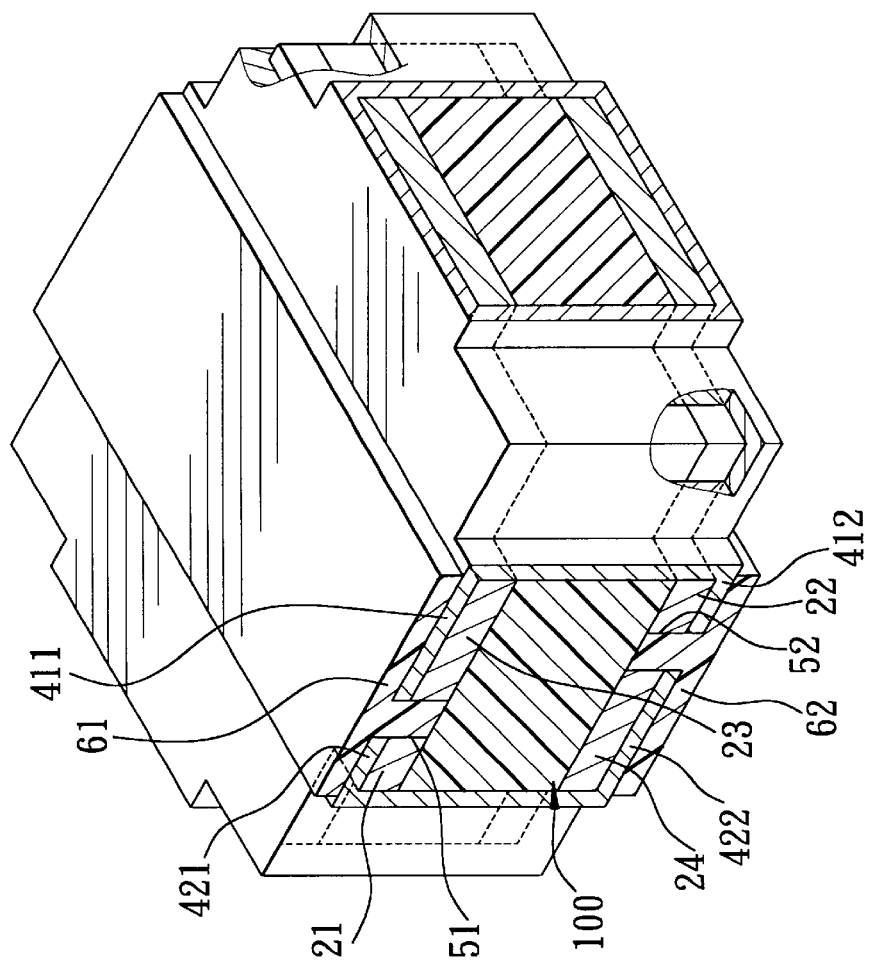
FIG. 9 illustrates two insulating layers formed on the assembly of the plating layer, the element, and the two metal foil layers of FIG. 8 according to the process of this invention.

In FIG. 9, a first insulating layer 61 is formed on portions of the first lateral segments 411, 421 of the first and second conductive layers 41, 42, and fills the first recess 51. A second insulating layer 62 is formed on portions of the second lateral segments 412, 422 of the first and second conductive layers 41, 42, and fills the second recess 52.

Figure 10:
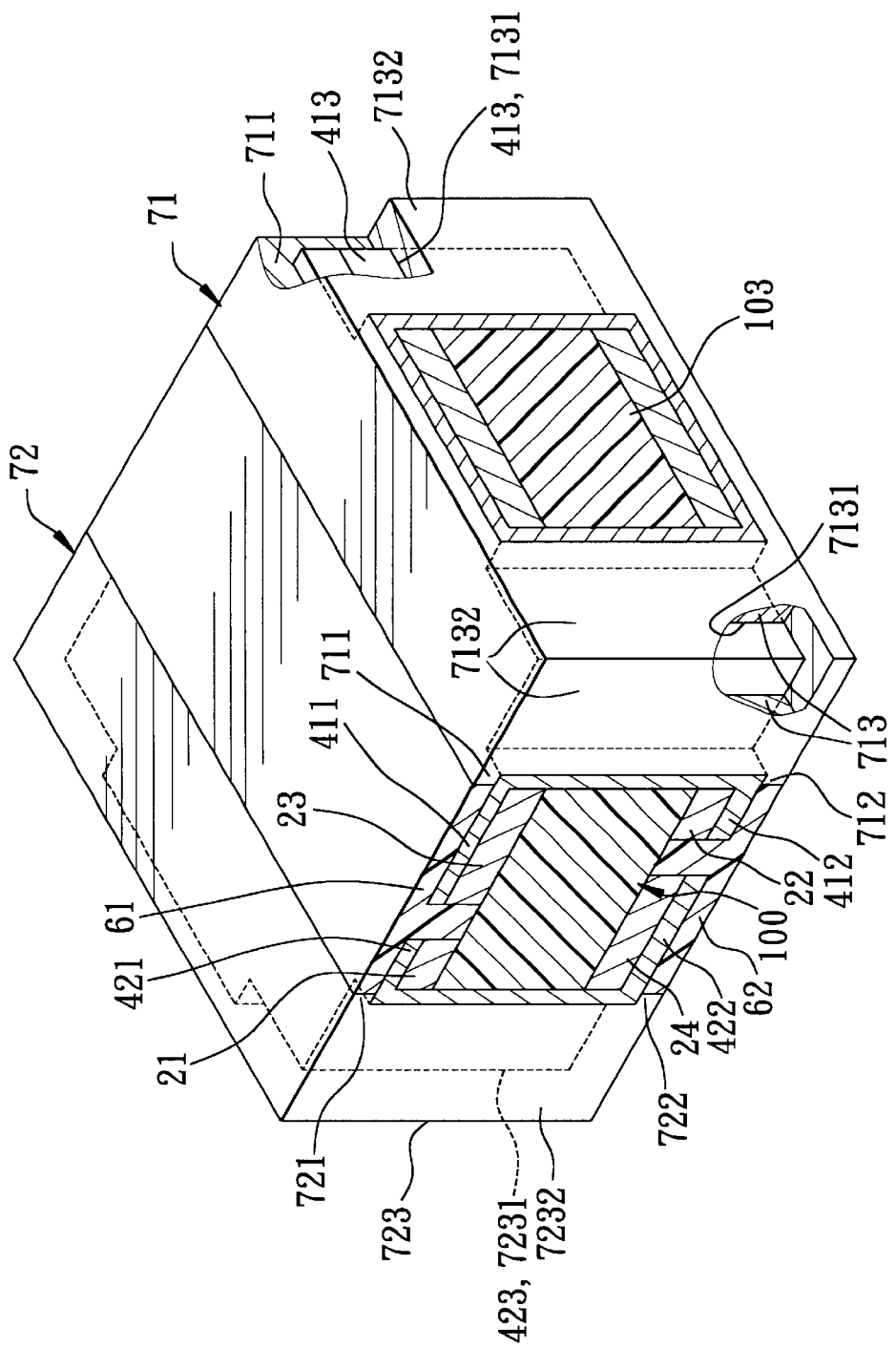
FIG. 10 illustrates two conductive layers formed on the assembly of the insulating layers, the plating layer, the element, and the two metal foil layers of FIG. 9 according to the process of this invention.

In FIG. 10, third and fourth conductive layers 71, 72 are respectively formed on the first and second conductive layers 41, 42. The third conductive layer 71 has a first lateral segment 711 formed on the remaining portion of the first lateral segment 411 of the first conductive layer 41, a second lateral segment 712 formed on the remaining portion of the second lateral segment 412 of the first conductive layer 41, and a transverse segment 713 formed on the transverse segment 413 of the first conductive layer 41. The transverse segment 713 of the third conductive layer 71 has an inner terraced face 7131 that conforms with the transverse segment 413 of the first conductive layer 41, and an L-shaped outer face 7132 that has two intersected faces respectively flush with two adjacent ones of the lateral faces 103. The fourth conductive layer 72 has a first lateral segment 721 formed on the remaining portion of the first lateral segment 421 of the second conductive layer 42, a second lateral segment 722 formed on the remaining portion of the second lateral segment 422 of the second conductive layer 42, and a transverse segment 723 formed on the transverse segment 423 of the second conductive layer 42. The transverse segment 723 of the fourth conductive layer 72 has an inner terraced face 7231 that conforms with the transverse segment 423 of the second conductive layer 42, and an L-shaped outer face 7232 that has two intersected faces respectively flush with two adjacent ones of the lateral faces 103.

After the formation of the third and fourth conductive layers 71, 72, the assembly of the PTC resistive sheet 200, the first, second, third, and fourth electrode layers 21, 22, 23, 24, the first and second insulating layers 61, 62, and the first, second, third, and fourth conductive layers 41, 42, 71, 72 is cut into the devices along the cutting lines 400. Each of the cutting lines 400 passes through centers of a respective row or a respective column of the cross-shaped bores 30.

Figure 11:
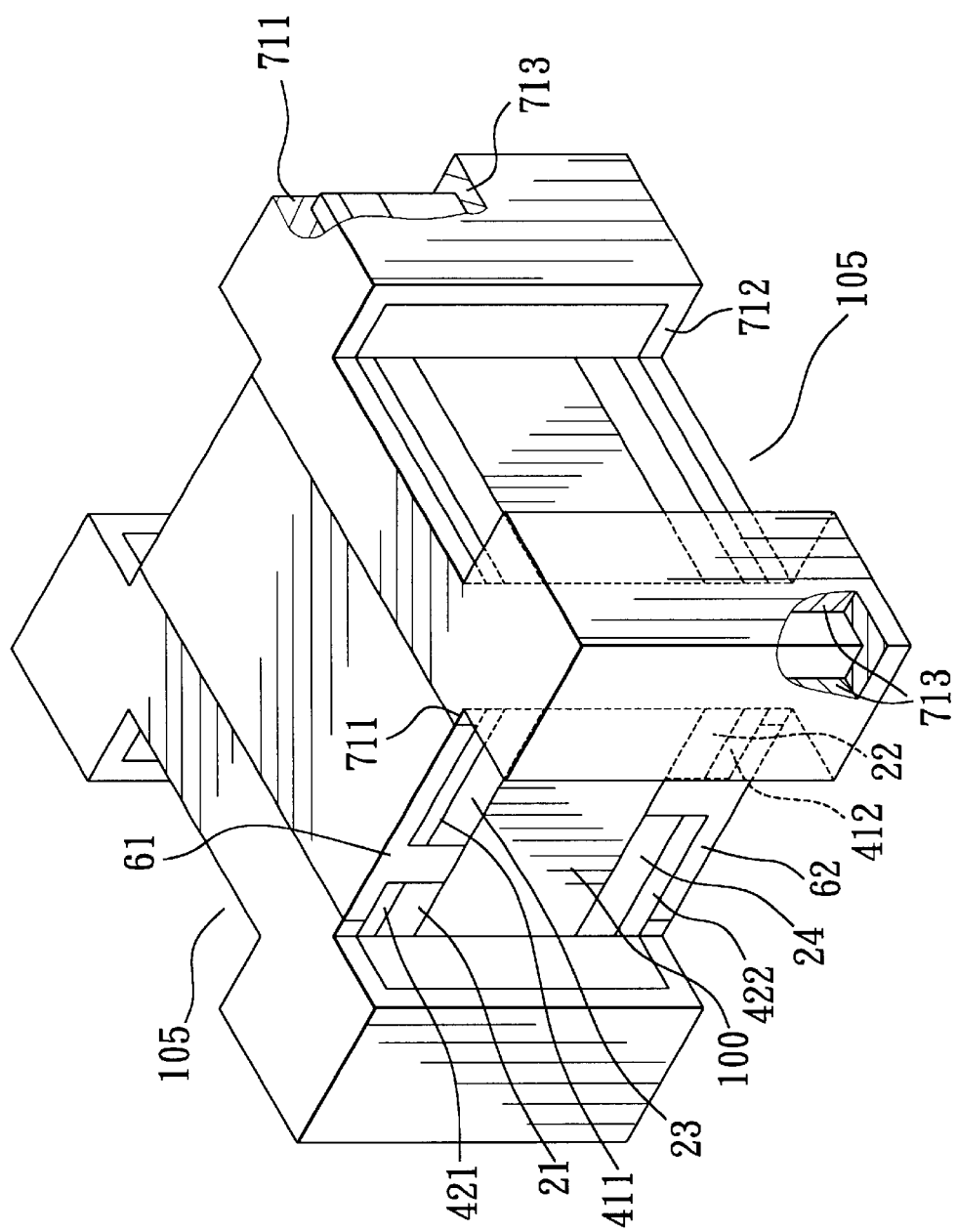
FIG. 11 is a perspective view of another surface mountable electrical device modified from that of FIG. 10.
Figure 12:
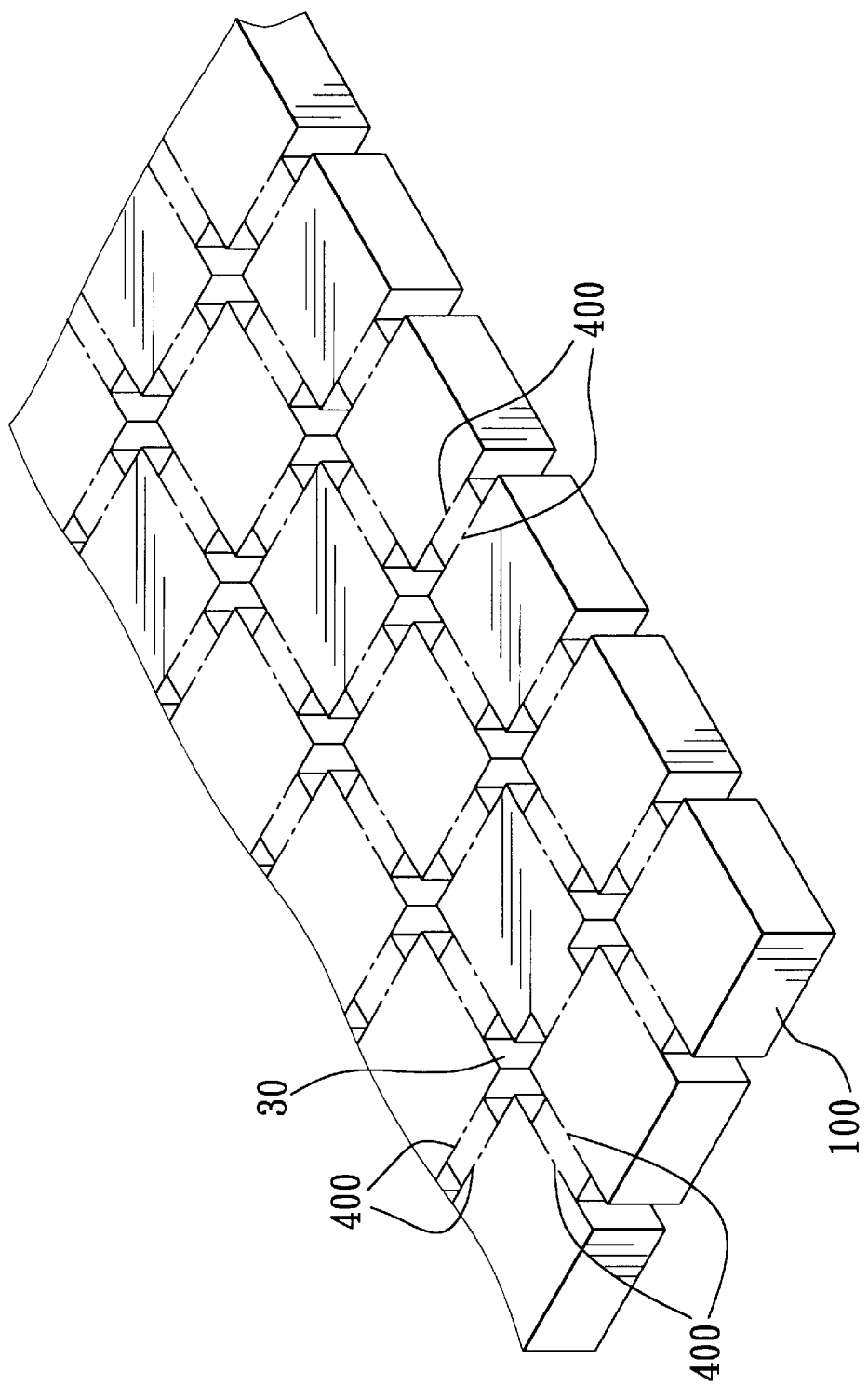
FIG. 12 is a perspective view to illustrate cutting lines for cutting the PTC resistive sheet into the elements for forming the surface mountable electrical device of FIG. 11.

FIG. 11 illustrates another embodiment of the device modified from that of FIG. 10. The process for making the device (see FIG. 12) is similar to that for making the previous device of FIG. 5. However, instead of one cutting line 400 passing through each two adjoining PTC resistive elements 100 (see FIG. 5), there are two parallel cutting lines 400 between each two adjoining PTC resistive elements 100 (see FIG. 12), which are offset from the centers of the associated row or column of the cross-shaped bores 30. As a consequence, each device will be formed with grooves 105 extending between each two adjacent corners 30' of a respective PTC resistive element 100 where the transverse segments 413, 423, 713, 723 of the first, second, third, and fourth conductive layers 41, 42, 71, 72 are formed.

With the design of the transverse segments 413, 423 of the first and second conductive layers 41, 42, the tendency for the transverse segments 413, 423 to be damaged or dislodged during the process of cutting as encountered in the prior art is significantly abated. Moreover, the process of this invention requires less accuracy in the cutting lines 400 as compared to the process of the prior art.

With the invention thus explained, it is apparent that various modifications and variations can be made without departing from the spirit of the present invention. It is therefore intended that the invention be limited only as recited in the appended claims.

We claim:

1. A surface mountable electrical device, comprising:
   a positive thermal coefficient resistive element having opposite first and second surfaces and a plurality of planar lateral faces transverse to and interconnecting said first and second surfaces, each of two adjacent ones of said lateral faces defining a corner therebetween, said corner being indented relative to said two adjacent ones of said lateral faces and having a terraced face that interconnects said two adjacent ones of said lateral faces and that has a first tread face extending from one of said two adjacent ones of said lateral faces, a first rise face extending from and transverse to said first tread face, a second tread face extending from and transverse to said first rise face in a same direction as said first tread face, and a second rise face extending from and transverse to said second tread face in a same direction as said first rise face to connect with the other one of said two adjacent ones of said lateral faces;
   first and second electrode layers formed respectively on said first and second surfaces;
   a third electrode layer formed on said first surface and spaced apart from said first electrode layer; and
   a first conductive layer that has a first lateral segment formed on said third electrode layer, a second lateral segment formed on said second electrode layer, and a transverse segment transverse to and interconnecting said first and second lateral segments, said transverse segment being formed on said terraced face of one of said corners and having a terraced cross-section corresponding to said terraced face of said one of said corners.

2. The surface mountable electrical device of claim 1, further comprising a fourth electrode layer formed on said second surface and spaced apart from said second electrode layer, and a second conductive layer opposite to said first conductive layer and having a first lateral segment formed on said first electrode layer, and a second lateral segment formed on said fourth electrode layer, and a transverse segment formed on another one of said corners and having a terraced cross-section corresponding to said terraced face of said another one of said corners.

3. The surface mountable electrical device of claim 2, further comprising a third conductive layer that has a first lateral segment formed on said first lateral segment of said first conductive layer, a second lateral segment formed on said second lateral segment of said first conductive layer, and a transverse segment that is formed on said transverse segment of said first conductive layer and that has an inner terraced face conforming with said transverse segment of said first conductive layer and an L-shaped outer face having two intersected faces respectively flush with two adjacent ones of said lateral faces, said surface mountable electrical device further comprising a fourth conductive layer that has a first lateral segment formed on said first lateral segment of said second conductive layer, a second lateral segment formed on said second lateral segment of said second conductive layer, and a transverse segment that has an inner terraced face conforming with said transverse segment of said second conductive layer and an L-shaped outer face having two intersected faces respectively flush with two adjacent ones of said lateral faces.

4. The surface mountable electrical device of claim 3, further comprising a first insulating layer to divide said first and third electrode layers apart, to space apart said first lateral segments of said first and second conductive layers, and to space apart said first lateral segments of said third and fourth conductive layers, and a second insulating layer to space apart said second and fourth electrode layers, to space apart said second lateral segments of said first and second conductive layers, and to space apart said second lateral segments of said third and fourth conductive layers.

* * * * *